US012604672B2

(12) United States Patent
van der Straten et al.

(10) Patent No.: US 12,604,672 B2
(45) Date of Patent: Apr. 14, 2026

(54) MRAM REFILL DEVICE STRUCTURE

(71) Applicant: INTERNATIONAL BUSINESS MACHINES CORPORATION, Armonk, NY (US)

(72) Inventors: Oscar van der Straten, Guilderland Center, NY (US); Praneet Adusumilli, Somerset, NJ (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 588 days.

(21) Appl. No.: 18/152,178

(22) Filed: Jan. 10, 2023

(65) Prior Publication Data

US 2024/0237548 A1     Jul. 11, 2024

(51) Int. Cl.
*H10N 50/80* (2023.01)
*H10B 61/00* (2023.01)
*H10N 50/01* (2023.01)
*H10N 50/20* (2023.01)

(52) U.S. Cl.
CPC .............. *H10N 50/80* (2023.02); *H10B 61/00* (2023.02); *H10N 50/01* (2023.02); *H10N 50/20* (2023.02)

(58) Field of Classification Search
CPC ........ H10N 50/80; H10N 50/20; H10N 50/10; H10B 61/00
See application file for complete search history.

(56) References Cited

U.S. PATENT DOCUMENTS

| | | | | |
|---|---|---|---|---|
| 7,527,986 | B1* | 5/2009 | Jung | G11C 11/161 |
| | | | | 438/85 |
| 9,502,640 | B1 | 11/2016 | Annunziata | |
| 9,559,294 | B2 | 1/2017 | Hsu | |
| 10,032,981 | B2 | 7/2018 | Han | |
| 10,069,064 | B1 | 9/2018 | Haq | |
| 10,573,811 | B2 | 2/2020 | Tseng | |
| 10,727,272 | B2 | 7/2020 | Chuang | |
| 10,937,945 | B2 | 3/2021 | Marchack | |
| 11,133,457 | B2 | 9/2021 | Patlolla | |
| 2004/0039871 | A1* | 2/2004 | Stobbs | G11C 11/16 |
| | | | | 711/105 |
| 2009/0209050 | A1 | 8/2009 | Wang | |
| 2011/0049655 | A1 | 3/2011 | Assefa | |
| 2016/0049447 | A1* | 2/2016 | Jung | H10B 63/80 |
| | | | | 257/4 |
| 2018/0040670 | A1* | 2/2018 | Glova | H10N 50/10 |
| 2018/0151623 | A1* | 5/2018 | Terai | H10B 63/24 |
| 2018/0269386 | A1* | 9/2018 | Tsubata | G11C 11/161 |

* cited by examiner

*Primary Examiner* — Shih Tsun A Chou
(74) *Attorney, Agent, or Firm* — Yuanmin Cai

(57) ABSTRACT

Embodiments of present invention provide a method of forming a MRAM structure. The method includes forming a dielectric layer on top of a bottom contact; creating an opening in the dielectric layer, the opening has a slant top edge; filling a bottom portion of the opening to form a bottom electrode; filling a top portion of the opening with a first ferromagnetic material to form a first ferromagnetic layer; forming a stack of blanket layers, including a blanket tunnel barrier layer, a blanket second ferromagnetic layer, and a blanket top electrode layer, on top of the first ferromagnetic layer; patterning the stack of blanket layers into a top portion of a magnetic tunnel junction stack that includes a tunnel barrier layer, a second ferromagnetic layer, and a top electrode; and forming a top contact in contact with the top electrode. A structure formed thereby is also provided.

11 Claims, 21 Drawing Sheets

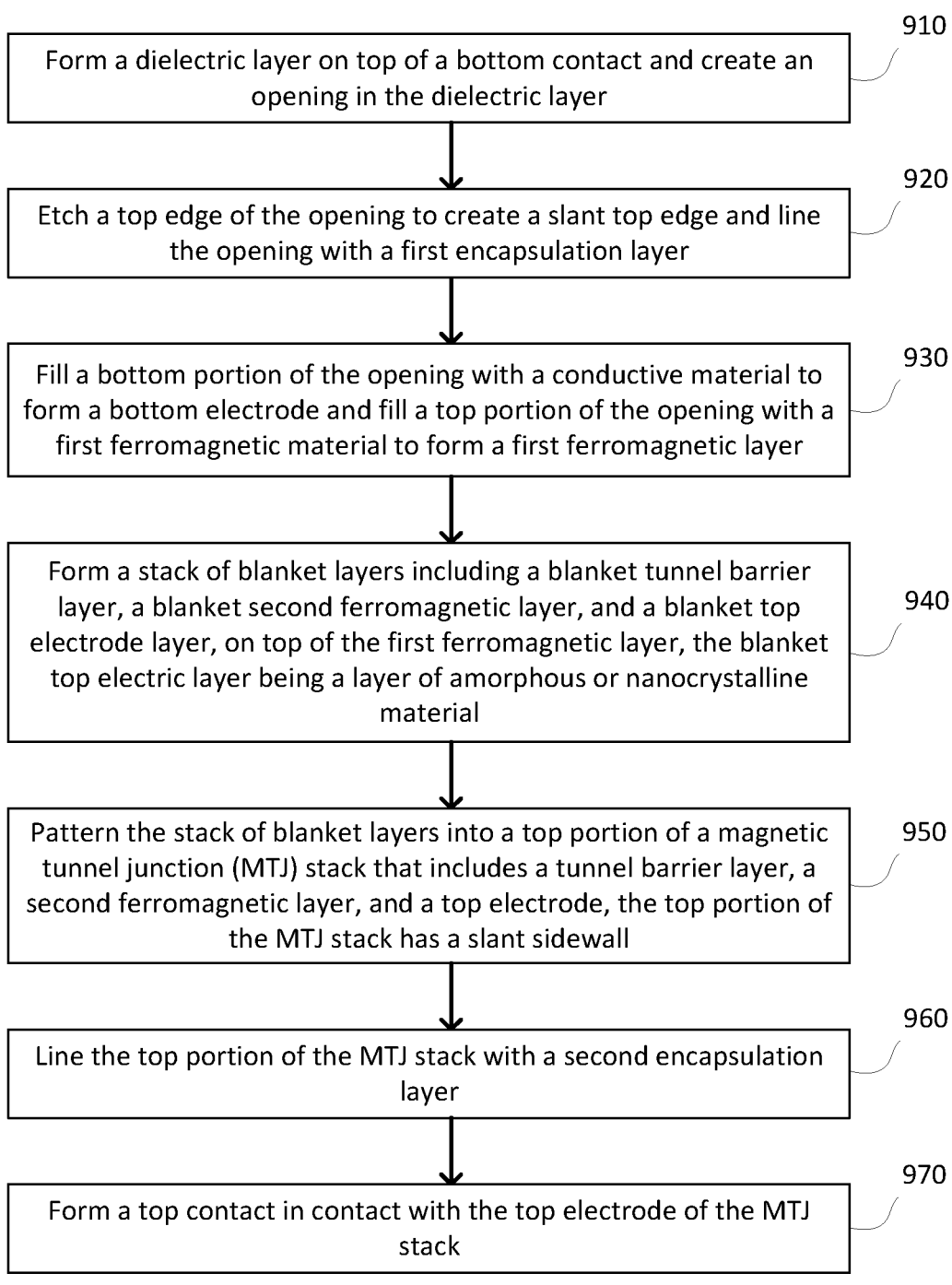

910

Form a dielectric layer on top of a bottom contact and create an opening in the dielectric layer

920

Etch a top edge of the opening to create a slant top edge and line the opening with a first encapsulation layer

930

Fill a bottom portion of the opening with a conductive material to form a bottom electrode and fill a top portion of the opening with a first ferromagnetic material to form a first ferromagnetic layer

940

Form a stack of blanket layers including a blanket tunnel barrier layer, a blanket second ferromagnetic layer, and a blanket top electrode layer, on top of the first ferromagnetic layer, the blanket top electric layer being a layer of amorphous or nanocrystalline material

950

Pattern the stack of blanket layers into a top portion of a magnetic tunnel junction (MTJ) stack that includes a tunnel barrier layer, a second ferromagnetic layer, and a top electrode, the top portion of the MTJ stack has a slant sidewall

960

Line the top portion of the MTJ stack with a second encapsulation layer

970

Form a top contact in contact with the top electrode of the MTJ stack

FIG. 21

MRAM REFILL DEVICE STRUCTURE

BACKGROUND

The present application relates to manufacturing of semiconductor integrated circuits. More particularly, it relates to method of forming a magnetoresistive random-access memory through a refill process and the structure formed thereby.

With the explosion of digital information, semiconductor memory devices are playing an ever increasingly important role in the managing and organizing of this digital information through, for example, storing, retrieving, and/or transformation of this digital information. Magnetoresistive random-access memory (MRAM) is a type of non-volatile memory (NVM) capable of holding saved data even in the event that power to the memory device is down or is accidentally cut off. There have been several recent developments in the technology that allow MRAM to be used successfully in specific emerging applications, as well as in not-so-new ones.

MRAM technology is based on a component known as magnetic tunnel junction (MTJ) that includes two ferromagnetic layers separated by an insulating layer knows as a tunnel barrier layer. In a vertical MRAM device, a top and a bottom electrode compliment the MTJ to form a vertical MTJ pillar. The vertical MTJ pillar is usually formed by the patterning of a stack of blanket layers corresponding to the MTJ stack. In other words, the stack of blanket layers may be etched through a reactive ion etch (RIE) and/or ion beam etch (IBE) process. However, such etching processes may sometimes come with re-sputtering effect, which causes metal elements from, for example, the blanket bottom electrode layer to be re-deposited onto sidewall surfaces of the ferromagnetic layers and/or the tunnel barrier layer that are above the bottom electrode layer, resulting shorts between the two ferromagnetic layers that should be otherwise isolated from each other by the tunnel barrier layer. Moreover, the hard masks used in the RIE and/or IBE etch processes are usually made of polycrystalline metal that is subsequently used as a top electrode. However, grain boundaries and defects in the polycrystalline metal hard mask may be transferred into the MTJ stack during the patterning process, resulting in a MTJ stack with high circular edge roughness (CER). The high CER of the MTJ stack negatively impacts the MRAM device performance.

SUMMARY

Embodiments of present invention provide a magnetoresistive random-access memory (MRAM) structure. The MRAM structure includes a magnetic tunnel junction (MTJ) stack, the MTJ stack, from a bottom to a top thereof, includes a bottom electrode; a first ferromagnetic layer; a tunnel barrier layer; a second ferromagnetic layer; and a top electrode, where the first ferromagnetic layer has a top surface and a bottom surface, the top surface being larger than the bottom surface and the bottom surface being directly above the bottom electrode.

In one embodiment, a top portion of the MTJ stack includes the top electrode, the second ferromagnetic layer, and the tunnel barrier layer, and the top portion of the MTJ stack has a slant sidewall and is above the first ferromagnetic layer.

In another embodiment, the first ferromagnetic layer and the bottom electrode are covered by a first encapsulation layer and the top portion of the MTJ stack is covered by a second encapsulation layer, wherein the first encapsulation layer and the second encapsulation layer are made of different materials. In one aspect, the first encapsulation layer is made of silicon-aluminum-nitride (SiAlN) or silicon-aluminum-oxynitride (SiAlON), and the second encapsulation layer is made of silicon-nitride (SiN) or silicon-carbonitride (SiCN).

In yet another embodiment, a bottom surface of the tunnel barrier layer has a size equal to or less than a size of the top surface of the first ferromagnetic layer.

In one embodiment, the top electrode is made of niobium-carbonitride (NbCN) or titanium-carbonitride (TiCN). In another embodiment, the first ferromagnetic layer is a reference layer, and the second ferromagnetic layer is a free layer. In yet another embodiment, the reference layer, the tunnel barrier layer, and the free layer form a spindle shape with the tunnel barrier layer at a middle thereof.

Embodiments of present invention also provide a semiconductor structure. The structure includes a magnetic tunnel junction (MTJ) stack, the MTJ stack includes a bottom electrode; a reference layer; a tunnel barrier layer; a free layer; and a top electrode; a first metal level in contact with the bottom electrode of the MTJ stack; and a second metal level in contact with the top electrode of the MTJ stack, wherein the reference layer has a top surface and a bottom surface and a slant sidewall, the top surface being larger than the bottom surface and the bottom surface being directly above the bottom electrode.

Embodiments of present invention further provide a method of forming a MRAM structure. The method includes forming a dielectric layer on top of a bottom contact; creating an opening in the dielectric layer, the opening has a slant top edge; filling a bottom portion of the opening with a conductive material to form a bottom electrode; filling a top portion of the opening, up to and including the slant top edge, with a first ferromagnetic material to form a first ferromagnetic layer; forming a stack of blanket layers, including a blanket tunnel barrier layer, a blanket second ferromagnetic layer, and a blanket top electrode layer, on top of the first ferromagnetic layer; patterning the stack of blanket layers into a top portion of a magnetic tunnel junction (MTJ) stack that includes a tunnel barrier layer, a second ferromagnetic layer, and a top electrode; and forming a top contact in contact with the top electrode.

In one embodiment, forming the stack of blanket layers includes forming the blanket top electrode layer by depositing a blanket layer of amorphous or nanocrystalline material, the amorphous or nanocrystalline material being either niobium-carbonitride (NbCN) or titanium-carbonitride (TiCN).

BRIEF DESCRIPTION OF THE DRAWINGS

The present invention will be understood and appreciated more fully from the following detailed description of embodiments of present invention, taken in conjunction with accompanying drawings of which:

FIG. 21 is a demonstrative illustration of a flow-chart of a method of manufacturing a MRAM device according to embodiments of present invention.

Figure 1:
FIGS. 1-20 are demonstrative illustrations of cross-sectional views of a MRAM device in steps of manufacturing thereof according to various embodiments of present invention.
Figure 1:
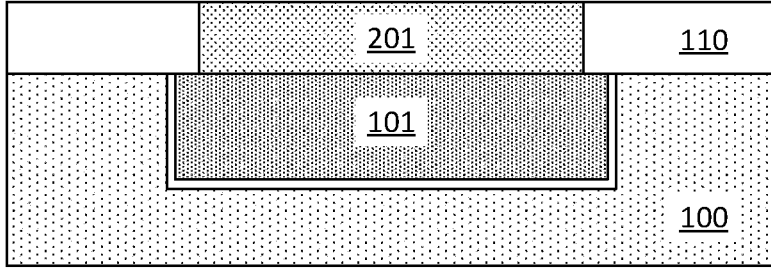

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a MRAM device in a step of manufacturing thereof according to one embodiment of present invention. The MRAM device may include one or more magnetic tunnel junction (MTJ) stacks. In one embodiment, the MTJ stacks may each have a substantially cylindrical form or shape when being viewed from a top thereof, although other forms or shapes are possible and these other forms or shapes are fully contemplated here as well. Hereinafter, it is to be understood that cross-sectional views of the illustrated MRAM device may be views of cross-sections made substantially along a diameter of the MTJ stacks, assuming the MTJ stacks having a substantially cylindrical form.

More particularly, embodiments of present invention provide forming a MRAM structure 10 (see FIG. 20 for a more fully manufactured structure) by receiving a supporting structure such as a dielectric material layer 100 therewithin there may be embedded a metal level. In one embodiment, this supporting structure may be, for example, a part of a back-end-of-line (BEOL) structure of a semiconductor chip and the semiconductor chip may include other semiconductor structures and elements such as, for example, front-end-of-line (FEOL) structures and middle-of-line (MOL) structures (now shown). This metal level may be, for example, a metal level 2 (M2), a metal level 3 (M3), etc., and may be made of conductive materials such as, for example, copper (Cu), cobalt (Co), tungsten (W), aluminum (Al), ruthenium (Ru) and other suitable conductive materials. This metal level may function or serve as a bottom contact of the MRAM structure 10 and may be referred to as a bottom contact 101 as well.

Embodiments of present invention may further provide forming a conductive cap 201 on top of the bottom contact 101 with the conductive cap 201 embedded or surrounded by a dielectric material layer 110. In forming the above structure, one embodiment of present invention may include first depositing a layer of conductive material on top of the supporting structure, and then patterning the layer of conductive material into the conductive cap 201. After the patterning, a dielectric material may be deposited to surround the conductive cap 201 and the dielectric material may subsequently be planarized through a chemical-mechanic-polishing (CMP) process to form the dielectric material layer 110. Alternatively, another embodiment of present invention may include first depositing the dielectric material layer 110 on top of the supporting structure and then patterning the dielectric material layer 110 to create an opening directly above and exposing the bottom contact 101. Subsequently the opening may be filled with a conductive material, followed by a CMP process, to form the conductive cap 201. In addition to the above embodiments, other known or future developed methods and/or processes may be used as well to form the conductive cap 201 and the surrounding dielectric material layer 110.

Figure 2:
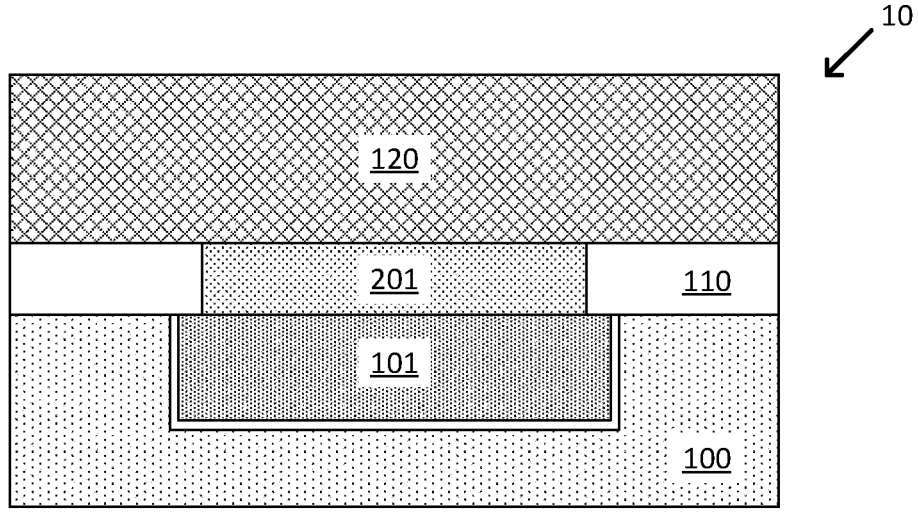

FIG. 2 is a demonstrative illustration of cross-sectional view of a MRAM device in a step of manufacturing thereof, following the step illustrated in FIG. 1, according to one embodiment of present invention. More particularly, embodiments of present invention provide forming a dielectric layer 120 on top of the conductive cap 201 and the surrounding dielectric material layer 110. The blanket dielectric layer 120 may be formed through, for example, a chemical-vapor-deposition (CVD) process, a physical-vapor-deposition (PVD) process, an atomic-layer-deposition (ALD) process, or any other suitable means and/or processes.

Figure 3:
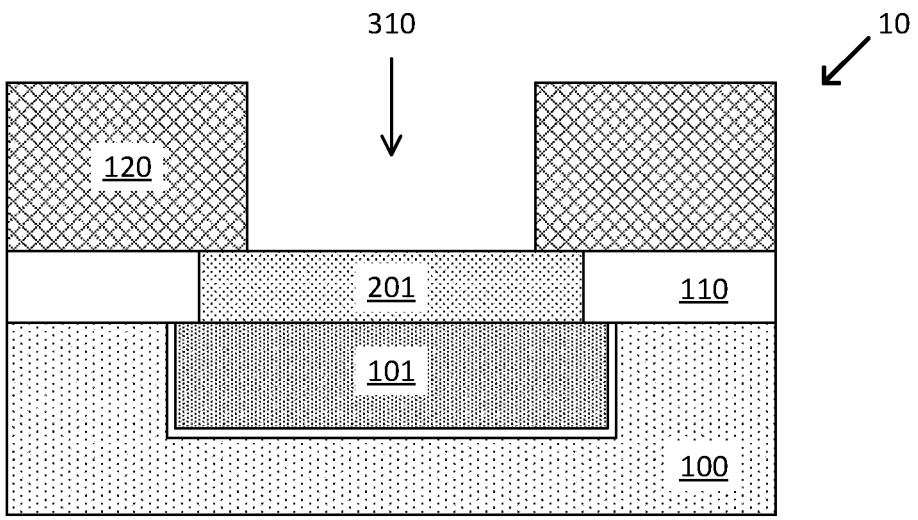

FIG. 3 is a demonstrative illustration of cross-sectional view of a MRAM device in a step of manufacturing thereof, following the step illustrated in FIG. 2, according to one embodiment of present invention. More particularly, embodiments of present invention provide creating an opening 310 in the dielectric layer 120 to expose the conductive cap 201. The opening 310 may generally be formed through a lithographically patterning and selective etching process and may be formed to have generally vertical sidewalls.

Figure 4:
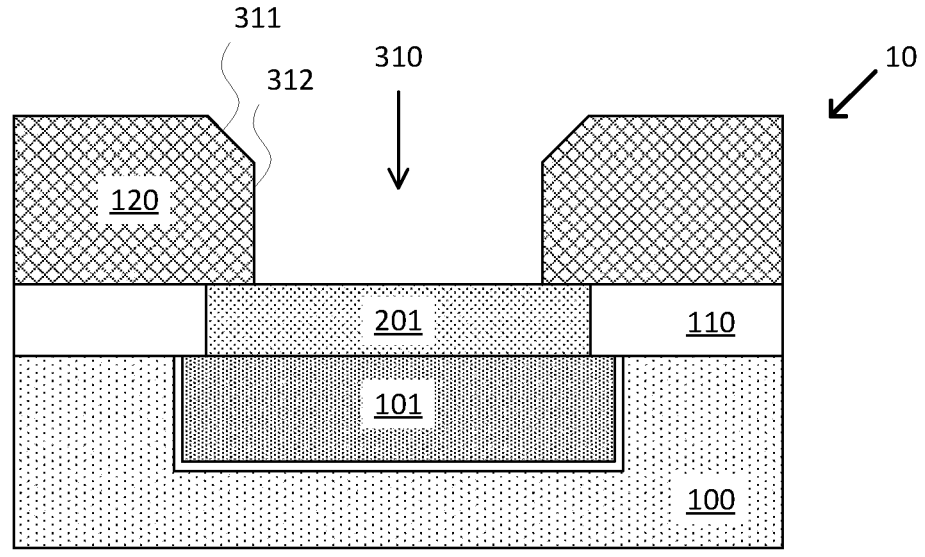

FIG. 4 is a demonstrative illustration of cross-sectional view of a MRAM device in a step of manufacturing thereof, following the step illustrated in FIG. 3, according to one embodiment of present invention. More particularly, embodiments of present invention provide performing an etching process such as, for example, a reactive-ion-etch (RIE) process to etch a top edge of the opening 310 into a slant top edge, resulting the opening 310 having a slant sidewall 311 and a vertical sidewall 312 that follows the slant sidewall 311. Transforming the top edge of the opening 310 into the slant top edge with a slant sidewall 311 helps forming a ferromagnetic layer therein, such as a reference layer, that has a top surface larger than a bottom surface with a slant sidewall. As will be described below in more details, a ferromagnetic layer with a slant sidewall may help reduce or even eliminate issues of re-sputtering of conductive material during downstream manufacturing steps, that are often the root cause of device shorts.

Figure 5:
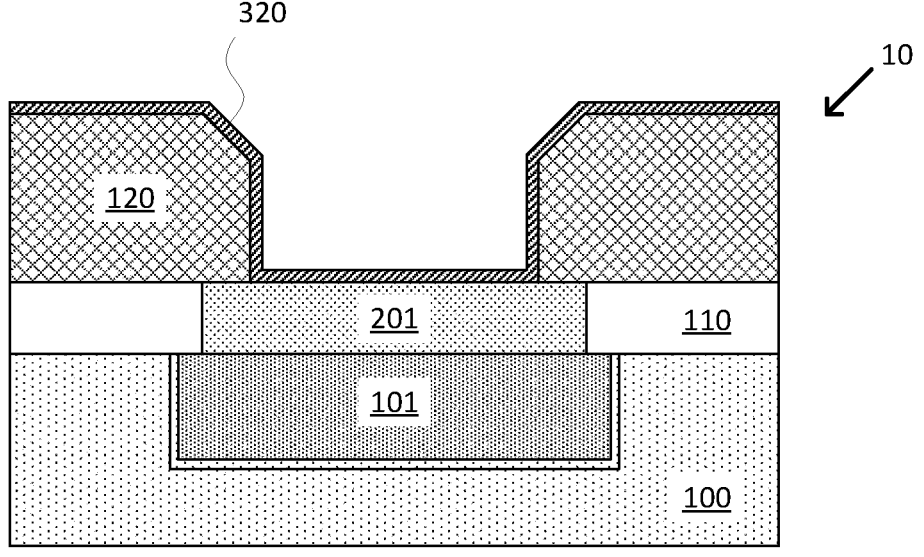

FIG. 5 is a demonstrative illustration of cross-sectional view of a MRAM device in a step of manufacturing thereof, following the step illustrated in FIG. 4, according to one embodiment of present invention. More particularly, embodiments of present invention provide forming a blanket first encapsulation layer 320 lining the slant sidewall 311 and the vertical sidewall 312 of the opening 310. The blanket first encapsulation layer 320 may also line a top surface of the dielectric layer 120 and a top surface of the exposed conductive cap 201. The blanket first encapsulation layer 320 may be a conformal dielectric liner of silicon-aluminum-nitride (SiAlN) or silicon-aluminum-oxynitride (SiAlON). However, embodiments of present invention may not be limited in this aspect and the blanket first encapsulation layer 320 may be of other materials such as SiN, SiCN, SiOCN, SiON, AlON, $Al_2O_3$, ZrO, and $SiO_2$ and may be formed through, for example, a CVD, PVD, or ALD process to have a thickness ranging from about 1 nm to about 10 nm.

Figure 6:
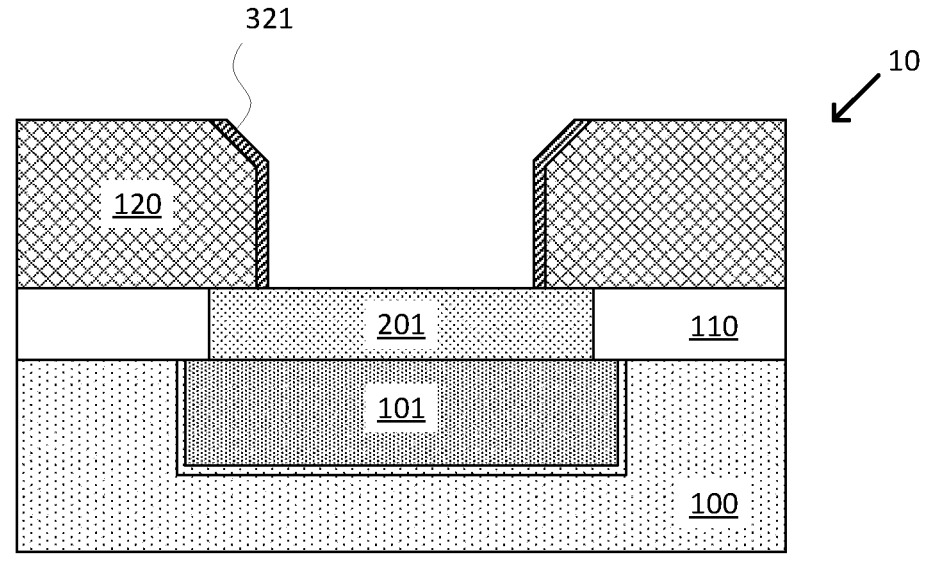

FIG. 6 is a demonstrative illustration of cross-sectional view of a MRAM device in a step of manufacturing thereof, following the step illustrated in FIG. 5, according to one embodiment of present invention. More particularly, embodiments of present invention provide performing a directional etching process, such as a RIE process, that selectively removes horizontal portions of the blanket first encapsulation layer 320, leaving only a first encapsulation layer 321 lining the slant sidewall 311 and the vertical sidewall 312 of the opening 310.

Figure 7:
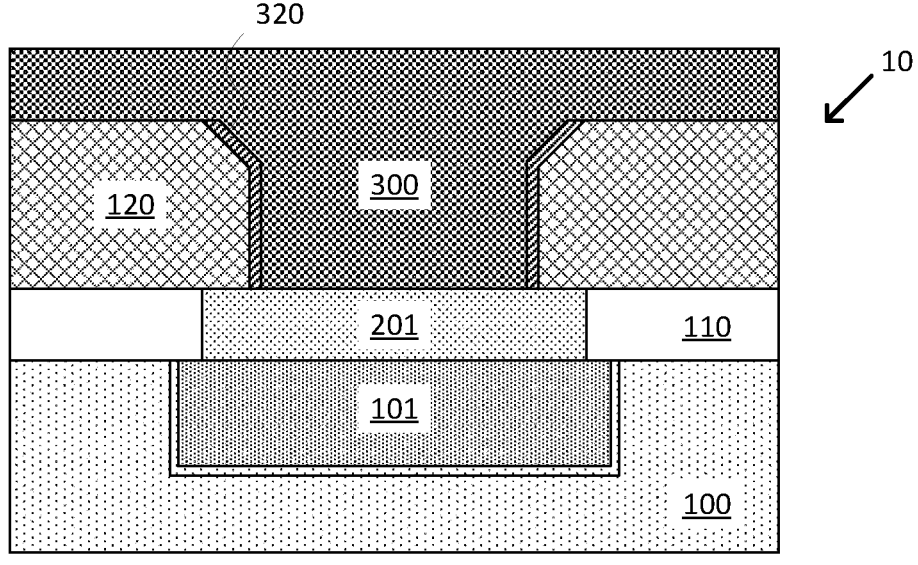

FIG. 7 is a demonstrative illustration of cross-sectional view of a MRAM device in a step of manufacturing thereof, following the step illustrated in FIG. 6, according to one embodiment of present invention. More particularly, embodiments of present invention provide filling the opening 310 with a conductive material 300 through a CVD, a PVD, and/or an ALD process. The conductive material 300 may fill a lower portion of the opening 310 that has the vertical sidewall 312, an upper portion of the opening 310 that has the slant sidewall 311, and may also cover the top surface of the dielectric layer 120.

Figure 8:
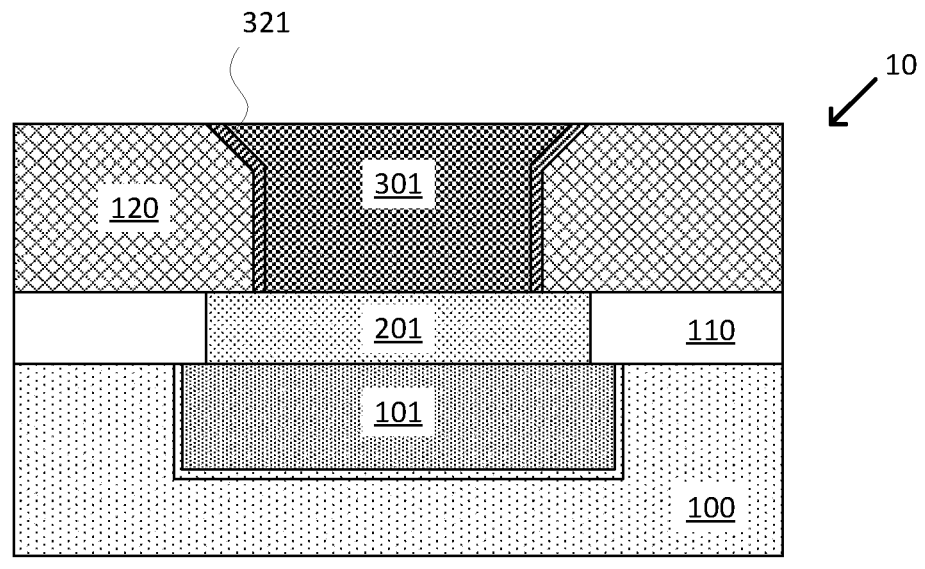

FIG. 8 is a demonstrative illustration of cross-sectional view of a MRAM device in a step of manufacturing thereof, following the step illustrated in FIG. 7, according to one embodiment of present invention. More particularly, embodiments of present invention provide removing the conductive material 300 from the top surface of the dielectric layer 120, such as by applying a CMP process, leaving only a portion of the conductive material 300, that is conductive material 301, within the opening 310 in the dielectric layer 120.

Figure 9:
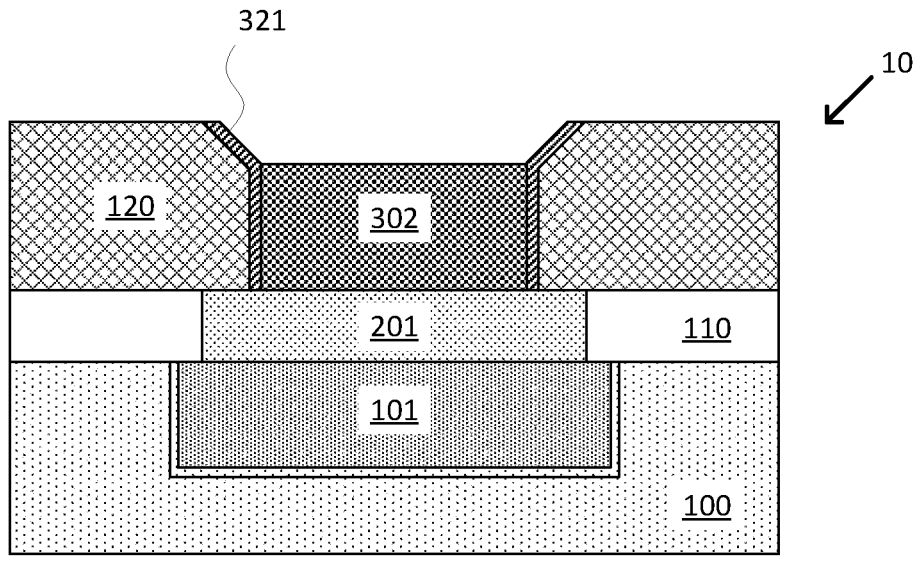

FIG. 9 is a demonstrative illustration of cross-sectional view of a MRAM device in a step of manufacturing thereof, following the step illustrated in FIG. 8, according to one embodiment of present invention. More particularly, embodiments of present invention provide further recessing the conductive material 301 through a selective etching process such as a wet etch process, or a selective dry etch process. In one embodiment, the recessing process may remove a portion of the conductive material 301 such that only a portion of the conductive material 301 remains within the lower portion of the opening 310 that is surrounded by the vertical sidewall 312 to form a bottom electrode 302. The bottom electrode 302 may have a top surface that is at or below the vertical sidewall 312.

Figure 10:
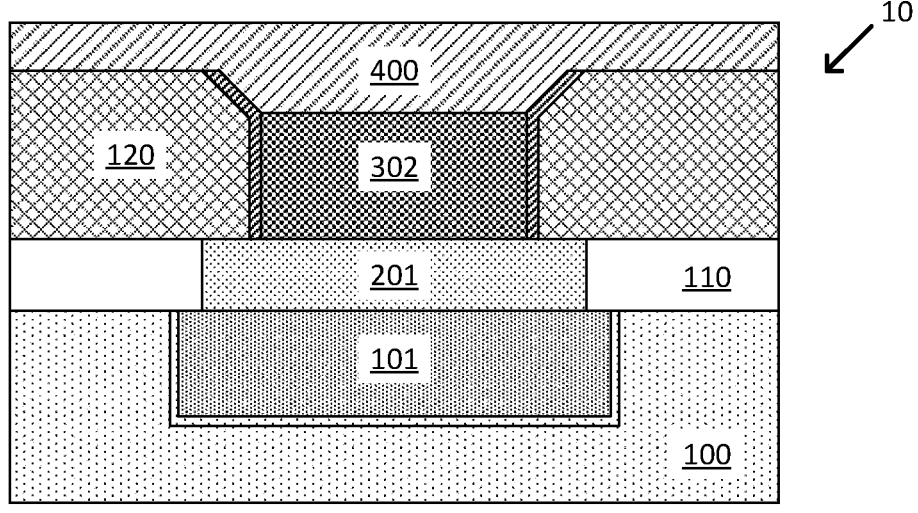

FIG. 10 is a demonstrative illustration of cross-sectional view of a MRAM device in a step of manufacturing thereof, following the step illustrated in FIG. 9, according to one embodiment of present invention. More particularly, embodiments of present invention provide filling the upper portion of the opening 310 with a blanket first ferromagnetic layer 400. A part of blanket first ferromagnetic layer 400 may thus be surrounded by the slant sidewall 312 of the opening 310. The blanket first ferromagnetic layer 400 may be deposited through a CVD, a PVD, or an ALD process and may be formed to also cover the top surface of the dielectric layer 120.

Figure 11:
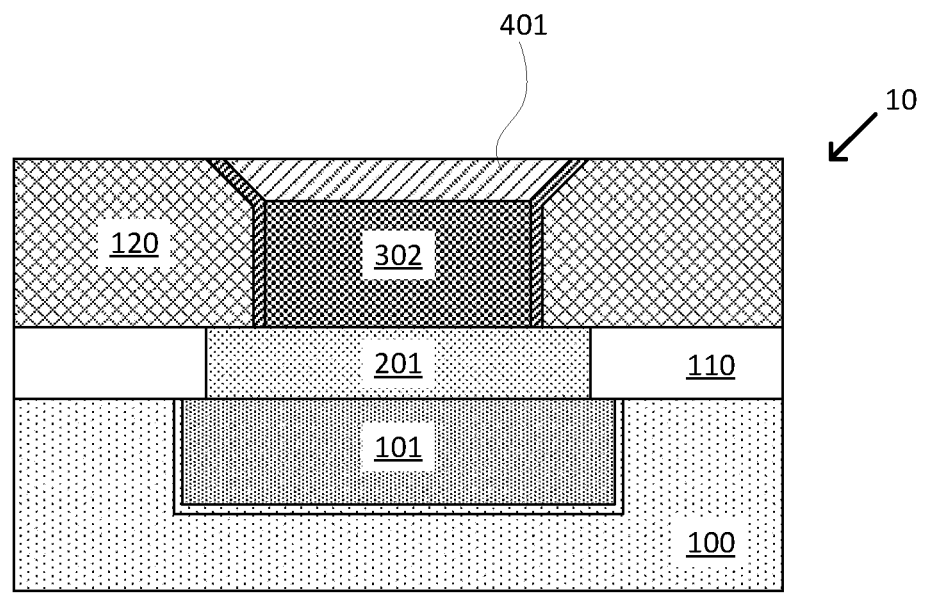

FIG. 11 is a demonstrative illustration of cross-sectional view of a MRAM device in a step of manufacturing thereof, following the step illustrated in FIG. 10, according to one embodiment of present invention. More particularly, embodiments of present invention provide removing the blanket first ferromagnetic layer 400 from the top surface of the dielectric layer 120 by applying a CMP process, leaving only a portion of the blanket first ferromagnetic layer 400, that is first ferromagnetic layer 401, within the opening 310 that is surrounded by the slant sidewall 311. Although not illustrated in FIG. 11, in one embodiment, a lower portion of the first ferromagnetic layer 401 may be surrounded by the vertical sidewall 312 of the opening 310.

As is demonstratively illustrated in FIG. 11, the first ferromagnetic layer 401 may have a top surface and a bottom surface and the top surface is larger than the bottom surface. In other words, the first ferromagnetic layer 401 may have a slant sidewall 410. Additionally, the bottom surface of the first ferromagnetic layer 401 may be directly above the bottom electrode 302.

In one embodiment, the first ferromagnetic layer 401 may be a layer of cobalt (Co), iron (Fe), and boron (B) based material (CoFeB) such as, for example, an alloy of Co, Fe, and B. However, embodiments of present invention are not limited in this aspect and the first ferromagnetic layer 401 may include other suitable materials such as, for example, an alloy of Co and Fe (CoFe) or an alloy of nickel (Ni) and Fe (NiFe). Moreover, the first ferromagnetic layer 401 may be a reference layer to include a Co-based synthetic anti-ferromagnetic layer. The first ferromagnetic layer 401 may have a thickness ranging from about 2 nm to about 30 nm.

Figure 12:
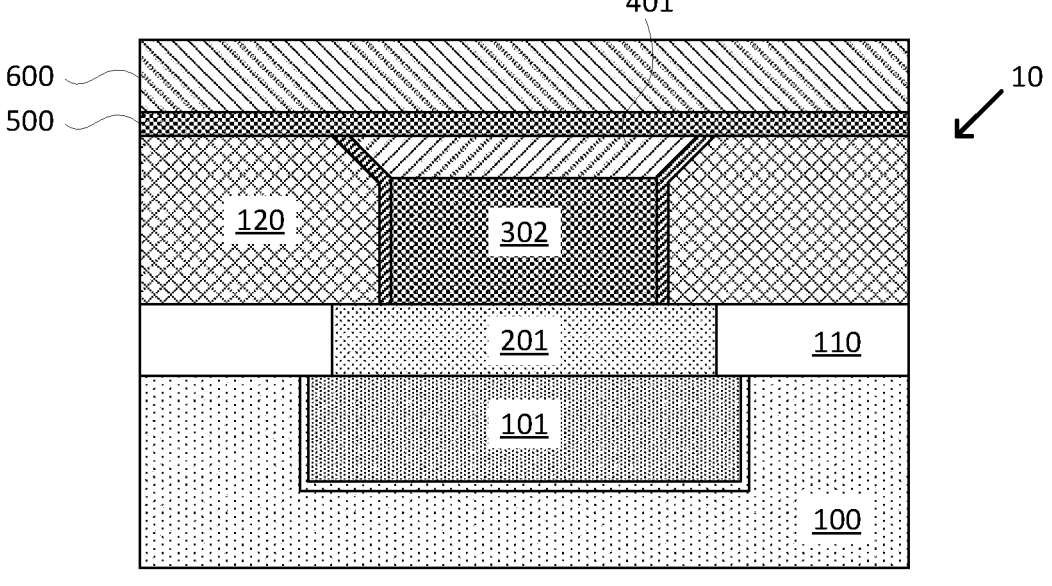

FIG. 12 is a demonstrative illustration of cross-sectional view of a MRAM device in a step of manufacturing thereof, following the step illustrated in FIG. 11, according to one embodiment of present invention. More particularly, embodiments of present invention provide forming a blanket tunnel barrier layer 500 on top of the first ferromagnetic layer 401 and the dielectric layer 120, and a blanket second ferromagnetic layer 600 on top of the blanket tunnel barrier layer 500.

Similar to the first ferromagnetic layer 401, in one embodiment, the blanket second ferromagnetic layer 600 may be a layer of cobalt (Co), iron (Fe), and boron (B) based material (CoFeB) such as, for example, an alloy of Co, Fe, and B. However, embodiments of present invention are not limited in this aspect and the blanket second ferromagnetic layer 600 may be of other suitable materials such as, for example, an alloy of Co and Fe (CoFe) or an alloy of nickel (Ni) and Fe (NiFe). The blanket second ferromagnetic layer 600 may be formed to have a thickness ranging from about 2 nm to about 30 nm.

On the other hand, the blanket tunnel barrier layer 500 may be a layer of magnesium-oxide (MgO) or other suitable materials such as, for example, aluminum-oxide ($Al_2O_3$) and/or titanium-oxide ($TiO_2$) and may be formed to have a thickness ranging from about 0.6 nm to about 1.2 nm.

Figure 13:
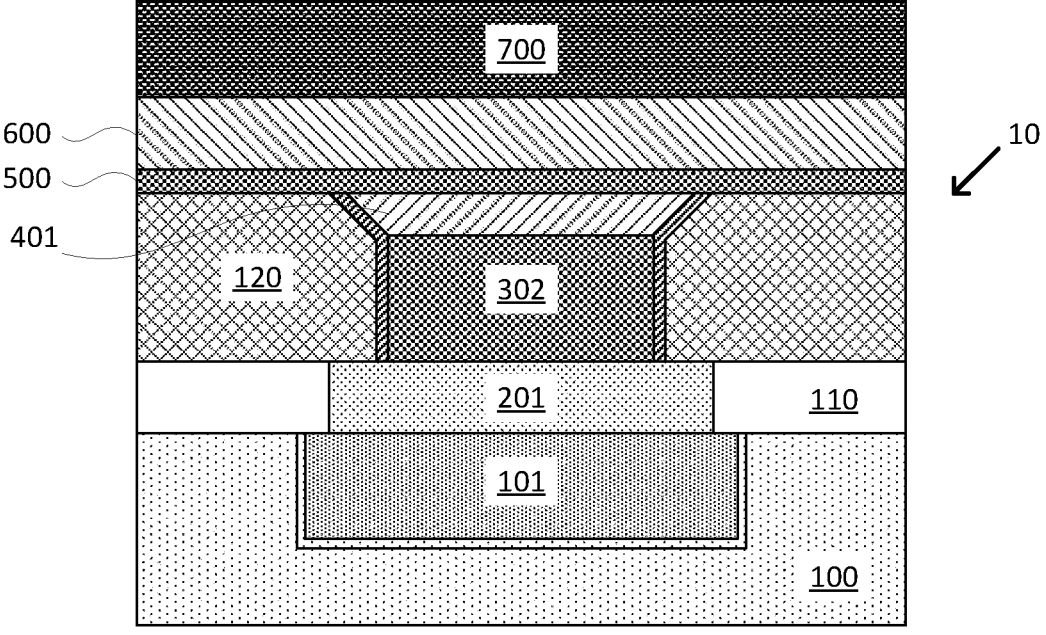

FIG. 13 is a demonstrative illustration of cross-sectional view of a MRAM device in a step of manufacturing thereof, following the step illustrated in FIG. 12, according to one embodiment of present invention. More particularly, embodiments of present invention provide forming a blanket top electrode layer 700 of amorphous or nanocrystalline material to be later formed into a top electrode. Unlike the polycrystalline metal hard mask conventionally used as a top electrode, the use of the amorphous or nanocrystalline material, which has a much finer grain size, helps improve the circular edge roughness (CER) during a process of forming the MTJ stacks.

Figure 14:
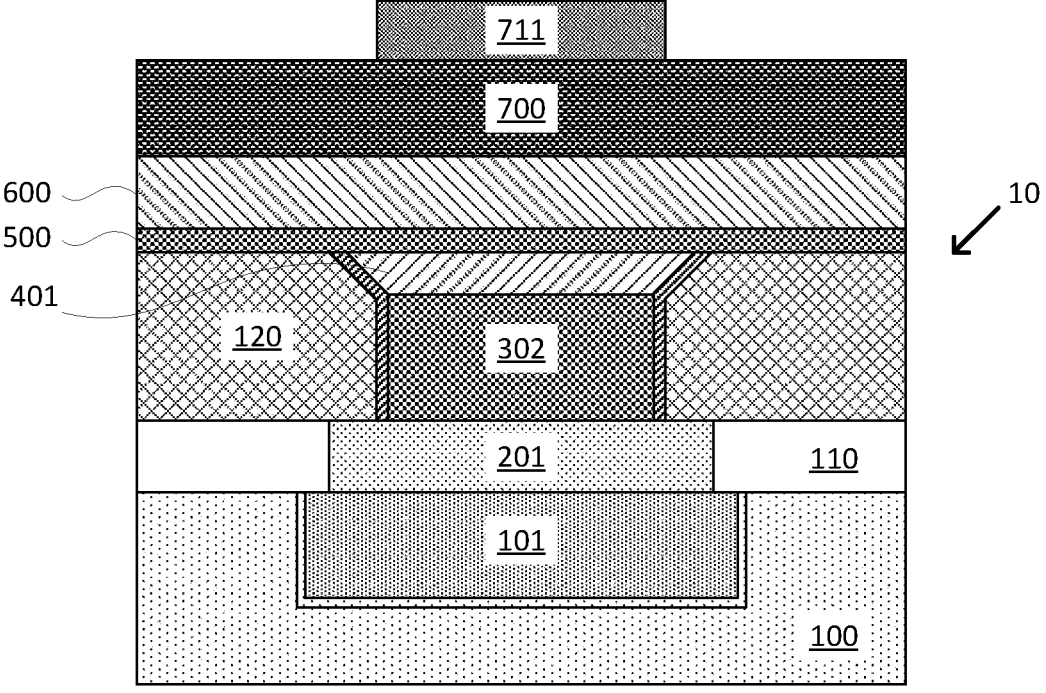

FIG. 14 is a demonstrative illustration of cross-sectional view of a MRAM device in a step of manufacturing thereof, following the step illustrated in FIG. 13, according to one embodiment of present invention. More particularly, embodiments of present invention provide forming a hard mask 711 above the blanket top electrode layer 700. The hard mask 711 may be formed to be substantially aligned with the bottom electrode 302 and may have a size that is comparable to a size of the bottom electrode 302. In other words, the size of the hard mask 711 may be smaller than the top surface of the first ferromagnetic layer 401.

Figure 15:
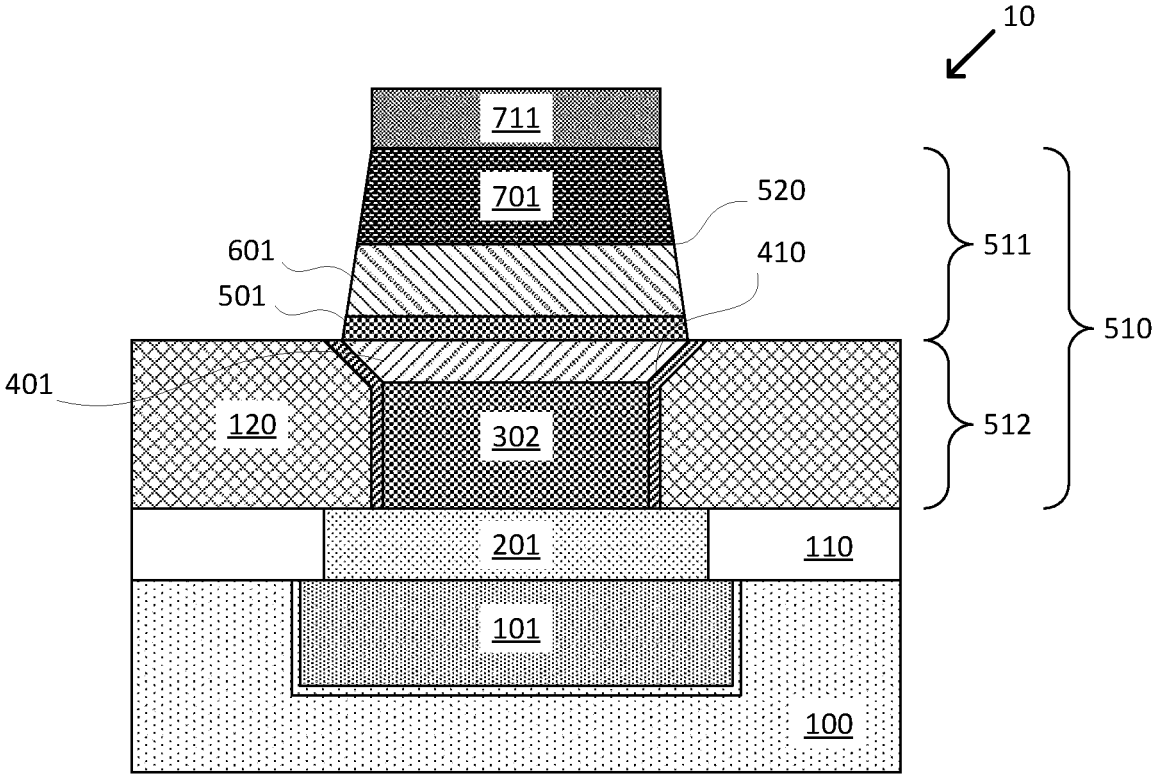

FIG. 15 is a demonstrative illustration of cross-sectional view of a MRAM device in a step of manufacturing thereof, following the step illustrated in FIG. 14, according to one embodiment of present invention. More particularly, embodiments of present invention provide using the hard mask 711 in a low-angle ion beam etch (IBE) process in etching the blanket top electrode layer 700, the blanket second ferromagnetic layer 600, and the blanket tunnel barrier layer 500, resulting a top portion 511 of a MTJ stack 510 that includes a top electrode 701, a second ferromagnetic layer 601, and a tunnel barrier layer 501. The MTJ stack 510 may also include a lower portion 512 thereof which includes the first ferromagnetic layer 401 and the bottom electrode 302. In one embodiment, the second ferromagnetic layer 601 is a free layer of the MTJ stack 510.

In one embodiment, the low-angle IBE process may form the top portion 511 of the MTJ stack 510 to have a slant sidewall 520. The top portion 511 of the MTJ stack 510 may have a top surface, that is the top surface of the top electrode 701, that has a substantially same size as a size of the hard mask 711. The top portion 511 of the MTJ stack 510 also has a bottom surface, that is the bottom surface of the tunnel barrier layer 501, that is equal to or less than a size of the top surface of the first ferromagnetic layer 401. In other words, the top portion 511 of the MTJ stack 510 includes the tunnel barrier layer 501 that has a top surface and a bottom surface with the bottom surface of the tunnel barrier layer 501 being directly above the first ferromagnetic layer 401; the second ferromagnetic layer 601 has a top surface and a bottom surface with the bottom surface of the second ferromagnetic layer 601 being directly above the tunnel barrier layer 501 and the top surface of the second ferromagnetic layer 601 being smaller than the bottom surface of the second ferromagnetic layer 601; and the top electrode 701 has a top surface and a bottom surface with the bottom surface of the top electrode 701 being directly above the second ferromagnetic layer 601 and the top surface of the top electrode 701 being smaller than the bottom surface of the top electrode 701.

Figure 16:
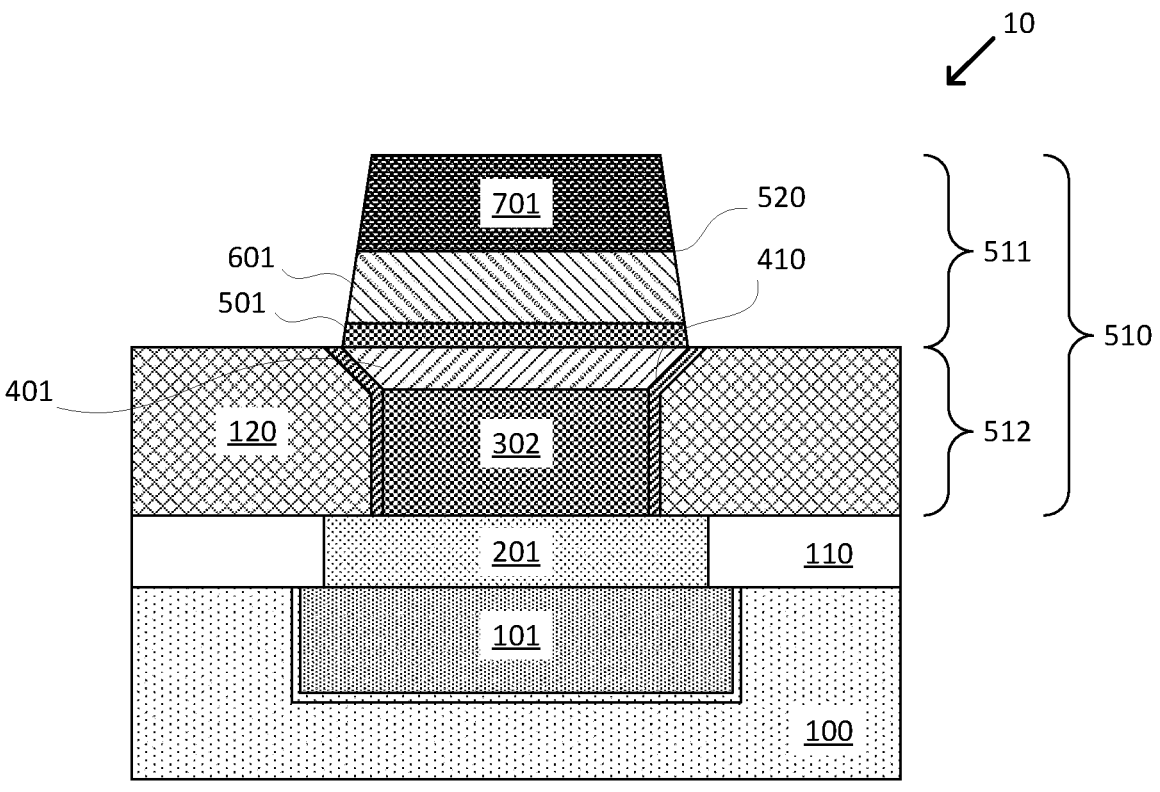

FIG. 16 is a demonstrative illustration of cross-sectional view of a MRAM device in a step of manufacturing thereof, following the step illustrated in FIG. 15, according to one embodiment of present invention. More particularly, embodiments of present invention provide selectively removing the hard mask 711. According to embodiments of present invention, the hard mask 711 is not used as a top electrode, different from currently existing art. Instead, embodiments of present invention use the blanket top electrode layer 700 of amorphous or nanocrystalline material to form the top electrode 701. The use of the amorphous or nanocrystalline material, such as NbCN or TiCN, greatly reduces the circular edge roughness (CER) of the MTJ stack 510 so produced. This is particularly significant when the MTJ stack 510 is compared with MTJ stacks that are produced using polycrystalline metal hard mask which is then used as a top electrode with high CER.

Figure 17:
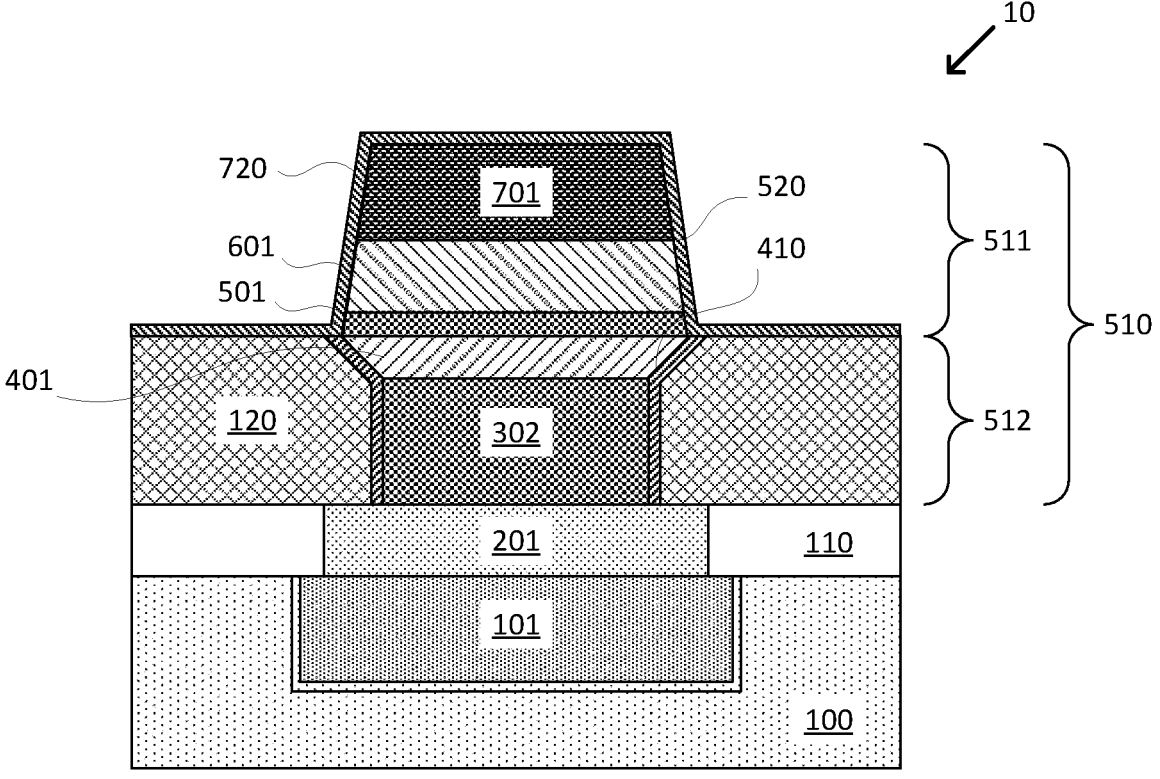

FIG. 17 is a demonstrative illustration of cross-sectional view of a MRAM device in a step of manufacturing thereof, following the step illustrated in FIG. 16, according to one embodiment of present invention. More particularly, embodiments of present invention provide forming a blanket second encapsulation layer 720 covering the top portion 511 of the MTJ stack 510 including the slant sidewall 520. The blanket second encapsulation layer 720 may also line a top surface of the dielectric layer 120 and a top surface of the top electrode 701. The blanket second encapsulation layer 720 may be a conformal dielectric liner of SiN or SiCN. However, embodiments of present invention may not be limited in this aspect and the blanket second encapsulation layer 720 may be of other materials such as SiOCN, SiON, SiAlN, SiAlON, AlON, $Al_2O_3$, ZrO, and $SiO_2$ and may be formed through, for example, a CVD, PVD, or ALD process to have a thickness ranging from about 1 nm to about 10 nm.

Figure 18:
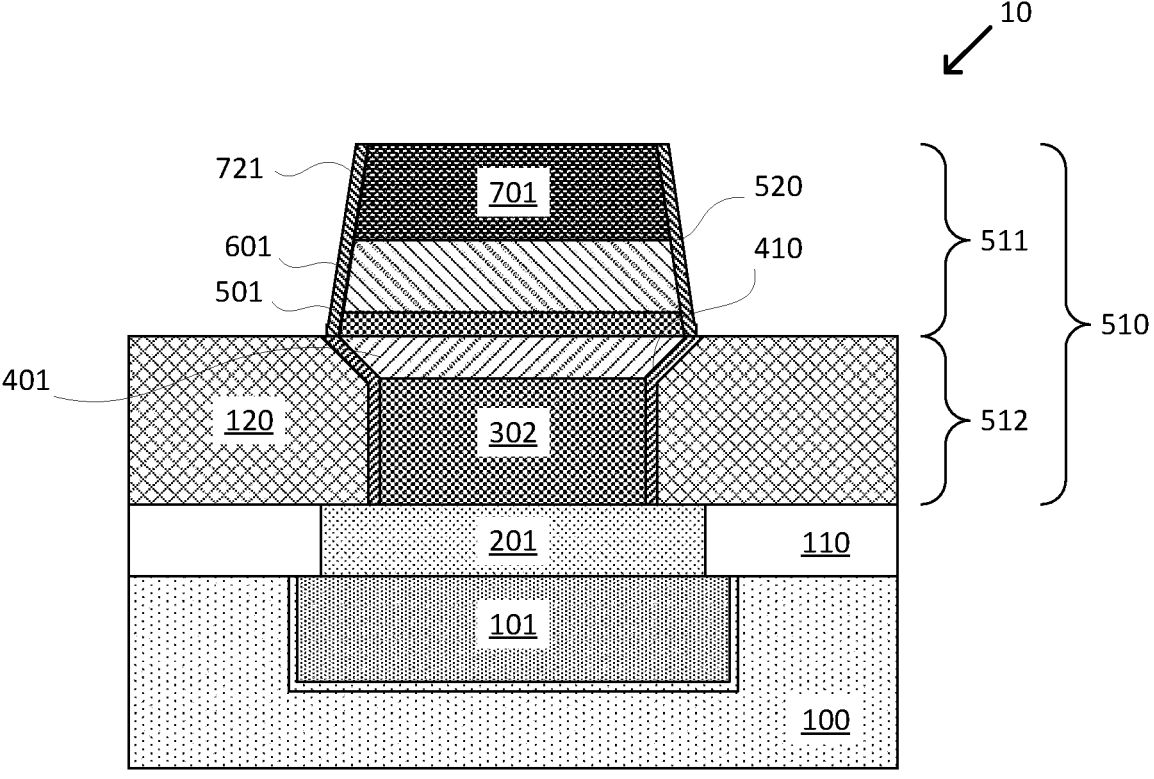

FIG. 18 is a demonstrative illustration of cross-sectional view of a MRAM device in a step of manufacturing thereof, following the step illustrated in FIG. 17, according to one embodiment of present invention. More particularly, embodiments of present invention provide performing a directional etching process, such as a RIE process, that selectively removes horizontal portions of the blanket second encapsulation layer 720, leaving only a second encapsulation layer 721 lining the slant sidewall 520 of the top portion 511 of the MTJ stack 510.

In one embodiment, the second encapsulation layer 721 may overlap with the first encapsulation layer 321 at the slant sidewall 520 of the top portion 511 of the MTJ stack 510 and the slant sidewall 410 of the first ferromagnetic layer 401. In another embodiment, the second encapsulation layer 721 and the first encapsulation layer 321 may be different in material. For example, the first encapsulation layer 321 may be made of SiAlN and the second encapsulation layer 721 may be made of SiN.

Figure 19:
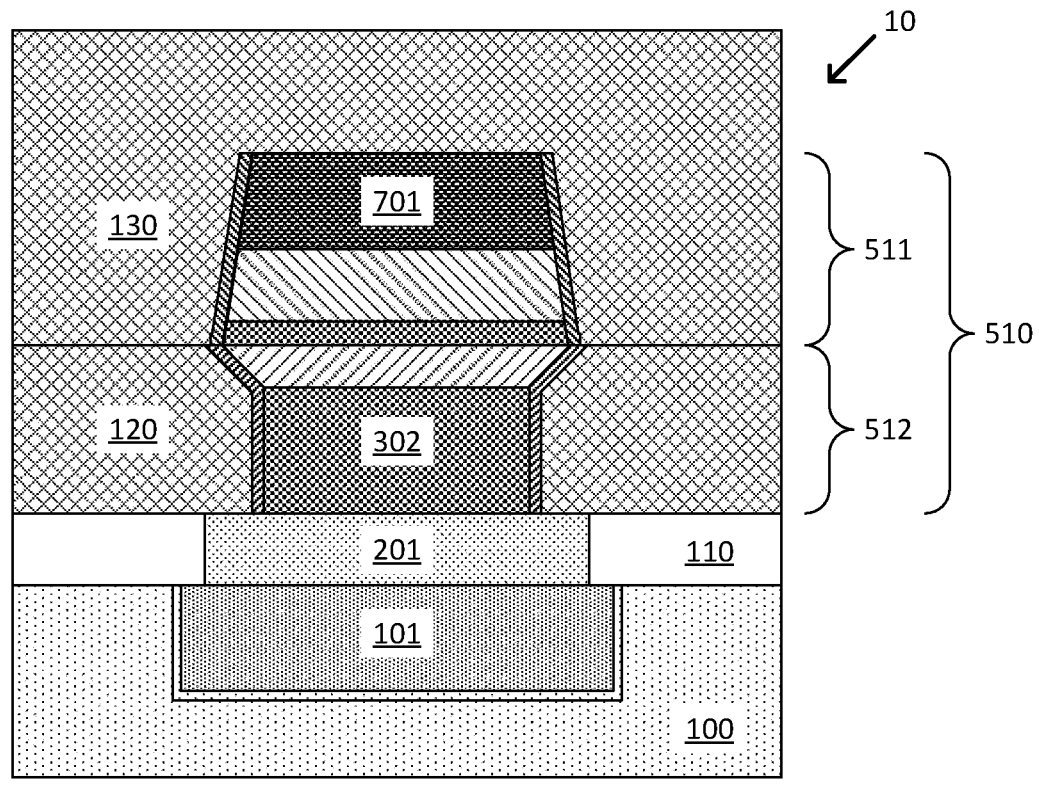

FIG. 19 is a demonstrative illustration of cross-sectional view of a MRAM device in a step of manufacturing thereof, following the step illustrated in FIG. 18, according to one embodiment of present invention. More particularly, embodiments of present invention provide forming another dielectric layer 130 covering the top portion of the MTJ stack to have a height higher than the top surface of the top electrode 701. The dielectric layer 130 may be different from the dielectric layer 120 in material composition but embodiments of present invention is not limited in this aspect. The dielectric layers 120 and 130 may be made of a same dielectric material.

Figure 20:
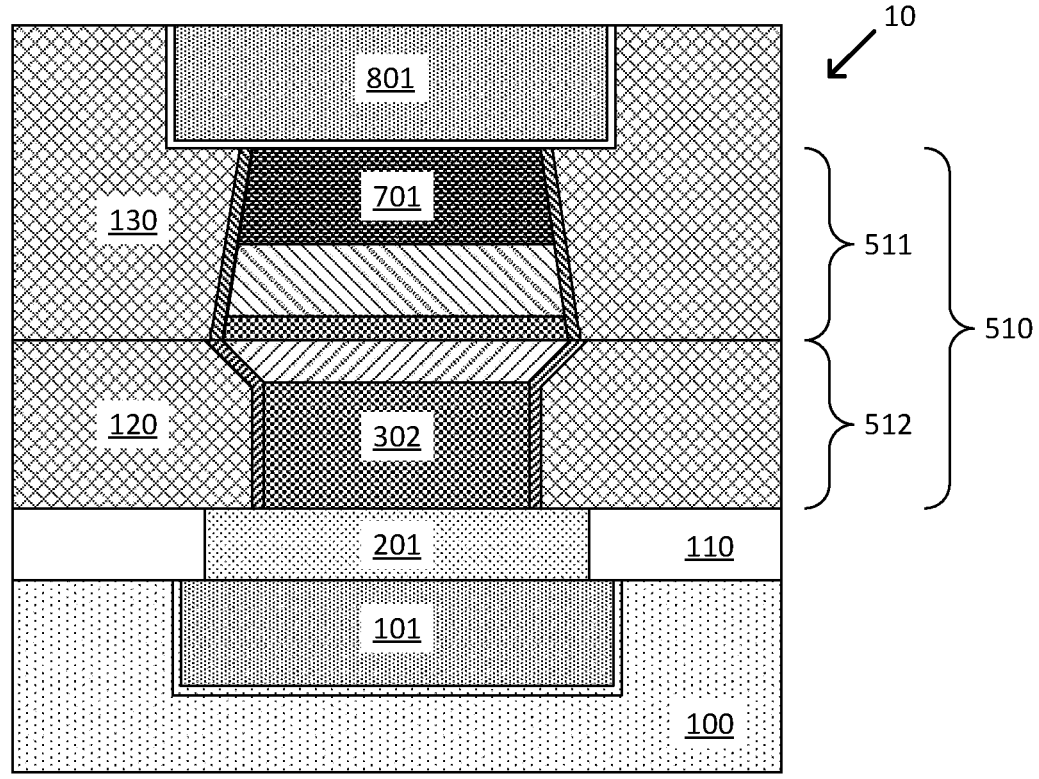

FIG. 20 is a demonstrative illustration of cross-sectional view of a MRAM device in a step of manufacturing thereof, following the step illustrated in FIG. 19, according to one embodiment of present invention. More particularly, embodiments of present invention provide forming a top contact 801 in contact with the top electrode 701. The top contact 801 may be made of, for example, tungsten (W), copper (Cu), aluminum (Al), cobalt (Co), ruthenium (Ru), and other suitable materials that are generally used for forming different metal levels in a BEOL environment. The top contact 801 may be embedded in the dielectric layer 130 or may be a different dielectric layer. In one embodiment, the top contact 801 may have a flat bottom surface that is in contact with a flat top surface of the top electrode 701.

FIG. 21 is a demonstrative illustration of a flow-chart of a method of manufacturing a MRAM device according to embodiments of present invention. The method includes (910) forming a bottom contact and forming a dielectric layer on top of the bottom contact and create an opening in the dielectric layer; (920) etching a top edge of the opening to create a slant top edge of the opening in a reactive-ion-etch (RIE) process, and lining the opening with a first encapsulation layer; (930) filling a bottom portion of the opening with a conductive material to form a bottom electrode and filling a top portion of the opening with a first ferromagnetic material to form a first ferromagnetic layer; (940) forming a stack of blanket layers including a blanket tunnel barrier layer, a blanket second ferromagnetic layer, and a blanket top electrode layer on top of the first ferromagnetic layer, where the blanket top electrode layer being a layer of amorphous or nanocrystalline materials such as NbCN or TiCN; (950) patterning the stack of blanket layers into a top portion of a magnetic tunnel junction (MTJ) stack that includes a tunnel barrier layer, a second ferromagnetic layer, and a top electrode, where the top portion of the MTJ stack has a slant sidewall; (960) lining the top portion of the MTJ stack with a second encapsulation layer that may be same or different from the first encapsulation layer in material; and (970) forming a top contact in contact with the top electrode of the MTJ stack.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A magnetoresistive random-access memory (MRAM) structure comprising:

a magnetic tunnel junction (MTJ) stack, the MTJ stack, from a bottom to a top thereof, includes a bottom electrode; a first ferromagnetic layer; a tunnel barrier layer; a second ferromagnetic layer; and a top electrode, wherein the first ferromagnetic layer has a top surface and a bottom surface, the top surface is larger than the bottom surface, a bottom surface of the tunnel barrier layer is in direct contact with the top surface of the first ferromagnetic layer, and a horizontal size of the bottom surface of the tunnel barrier layer is less than a horizontal size of the top surface of the first ferromagnetic layer.

2. The MRAM structure of claim 1, wherein a top portion of the MTJ stack includes the top electrode, the second ferromagnetic layer, and the tunnel barrier layer, and the top portion of the MTJ stack has a slant sidewall and is above the first ferromagnetic layer.

3. The MRAM structure of claim 2, wherein the first ferromagnetic layer and the bottom electrode are covered by a first encapsulation layer and the top portion of the MTJ stack is covered by a second encapsulation layer, wherein the first encapsulation layer and the second encapsulation layer are made of different materials.

4. The MRAM structure of claim 3, wherein the first encapsulation layer is made of silicon-aluminum-nitride (SiAlN) or silicon-aluminum-oxynitride (SiAlON), and the second encapsulation layer is made of silicon-nitride (SiN) or silicon-carbonitride (SiCN).

5. The MRAM structure of claim 1, wherein the top electrode is made of niobium-carbonitride (NbCN) or titanium-carbonitride (TiCN).

6. The MRAM structure of claim 1, wherein the first ferromagnetic layer is a reference layer, and the second ferromagnetic layer is a free layer.

7. The MRAM structure of claim 6, wherein the reference layer, the tunnel barrier layer, and the free layer form a spindle shape with the tunnel barrier layer at a middle thereof.

8. A semiconductor structure comprising:

a magnetic tunnel junction (MTJ) stack, the MTJ stack includes a bottom electrode; a reference layer; a tunnel barrier layer; a free layer; and a top electrode;

a first metal level in contact with the bottom electrode of the MTJ stack; and a second metal level in contact with the top electrode of the MTJ stack, wherein the reference layer has a top surface and a bottom surface and a slant sidewall, the top surface being larger than the bottom surface and the bottom surface being directly above the bottom electrode; a top portion of the MTJ stack includes the top electrode, the free layer, and the tunnel barrier layer to be above the reference layer; the top portion of the MTJ stack has a slant sidewall; a top surface of the top portion of the MTJ stack is smaller than a bottom surface of the top portion of the MTJ stack; the reference layer and the bottom electrode are covered by a first encapsulation layer and the top portion of the MTJ stack is covered by a second encapsulation layer; and the first encapsulation layer and the second encapsulation layer are made of different materials.

9. The semiconductor structure of claim 8, wherein the top electrode is made of niobium-carbonitride (NbCN) or titanium-carbonitride (TiCN).

10. The semiconductor structure of claim 8, wherein the reference layer, the tunnel barrier layer, and the free layer form a spindle shape with the tunnel barrier layer at a middle thereof.

11. The semiconductor structure of claim 8, wherein the tunnel barrier layer has a top surface and a bottom surface, the bottom surface of the tunnel barrier layer being directly above the reference layer; the free layer has a top surface and a bottom surface, the bottom surface of the free layer being directly above the tunnel barrier layer and the top surface of the free layer being smaller than the bottom surface of the free layer; and the top electrode has a top surface and a bottom surface, the bottom surface of the top electrode being directly above the free layer and the top surface of the top electrode being smaller than the bottom surface of the top electrode.

* * * * *